United States Patent [19]
Hillis et al.

[11] Patent Number: 5,317,481
[45] Date of Patent: May 31, 1994

[54] CIRCUIT BOARD AND INSERTION TOOL

[75] Inventors: W. Daniel Hillis, Cambridge; William Gerner, Oxford, both of Mass.

[73] Assignee: Thinking Machines Corporation, Cambridge, Mass.

[21] Appl. No.: 47,139

[22] Filed: Apr. 13, 1993

Related U.S. Application Data

[60] Division of Ser. No. 860,191, Mar. 26, 1992, Pat. No. 5,238,423, which is a continuation-in-part of Ser. No. 715,102, Jun. 13, 1991, abandoned.

[51] Int. Cl.$^5$ .............................................. H05K 7/14
[52] U.S. Cl. ..................... 361/796; 361/752; 361/759; 361/784; 361/785; 211/41; 439/259; 29/242
[58] Field of Search ............... 361/796, 784, 785, 724, 361/725, 748, 752, 759; 211/41; 439/259, 260–265; 29/242

[56] References Cited

U.S. PATENT DOCUMENTS

| | | | |
|---|---|---|---|
| 3,178,214 | 4/1965 | Tinkelenberg | 294/15 |
| 3,335,386 | 8/1967 | Upton | 339/17 |
| 3,476,258 | 11/1969 | Dorsett | 211/41 |
| 3,484,129 | 12/1969 | Askren | 294/15 |
| 3,617,083 | 11/1971 | Koppensteiner | 294/15 |
| 3,903,576 | 9/1975 | Stein | 29/203 |
| 3,944,311 | 3/1976 | Sprenkle et al. | 339/45 M |
| 4,223,934 | 9/1980 | Cauceglia et al. | 294/15 |
| 4,243,283 | 1/1981 | McSparran | 339/14 R |
| 4,352,533 | 10/1982 | Murase et al. | 339/17 |
| 4,367,583 | 1/1983 | Baccei | 29/739 |
| 4,445,740 | 5/1984 | Wallace | 339/45 M |
| 4,454,552 | 6/1984 | Barnes et al. | 361/9 |
| 4,480,884 | 11/1984 | Babuka et al. | 339/17 L |
| 4,553,322 | 11/1985 | Cappos et al. | 29/739 |
| 4,631,637 | 12/1986 | Romania et al. | 361/413 |
| 4,692,120 | 9/1987 | Feinstein | 439/62 |
| 4,731,924 | 3/1988 | Rapp | 29/837 |
| 4,778,401 | 10/1988 | Boudreau et al. | 439/153 |
| 4,850,884 | 7/1989 | Sawai et al. | 439/76 |
| 4,869,675 | 9/1989 | Ogawa | 439/76 |
| 4,917,616 | 4/1990 | Demler, Jr. et al. | 439/101 |

Primary Examiner—Leo P. Picard
Assistant Examiner—Young Whang
Attorney, Agent, or Firm—Weingarten, Schurgin, Gagnebin & Hayes

[57] ABSTRACT

A system for installing a circuit board edge connector into a motherboard connector from the side to accommodate high density card arrangements that obstruct overhead clearance. In one embodiment, the system utilizes an insertion tool which conveys the circuit board across the motherboard and positions it with the pins of both boards aligned. The tool locates the board adjacent the motherboard with the aligned connectors just touching and blocked against withdrawal. The cooperation between ramps and pins associated with the tool and circuit board applies a force, upon the withdrawal of the tool from the motherboard, to engage fully the pins of the circuit board with the pins of the motherboard. The extraction of the circuit board from the motherboard uses the tool in a reverse sequence. In a second embodiment the system includes a circuit board incorporating slidably configured rail and groove mechanism and a bell crank that allows the circuit board to slide in over the motherboard through relative sliding of the rail and groove and permits the two boards to be drawn together with mating pins by activation of the bell crank. In yet another embodiment the system includes a circuit board incorporating a spacer and a cardcage incorporating a spacer track which permits increased utilization of the circuit board surface for the placement of components.

19 Claims, 18 Drawing Sheets

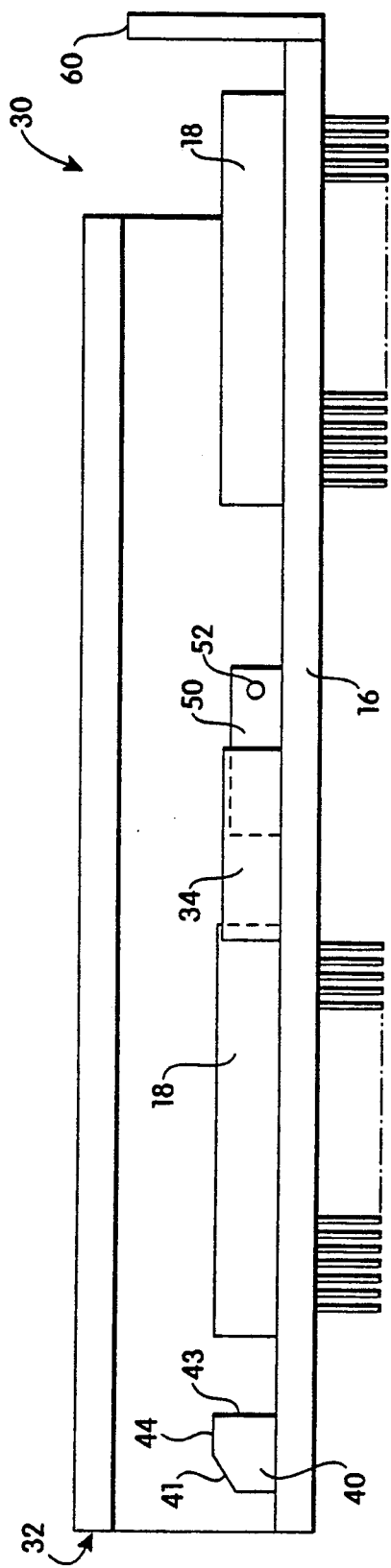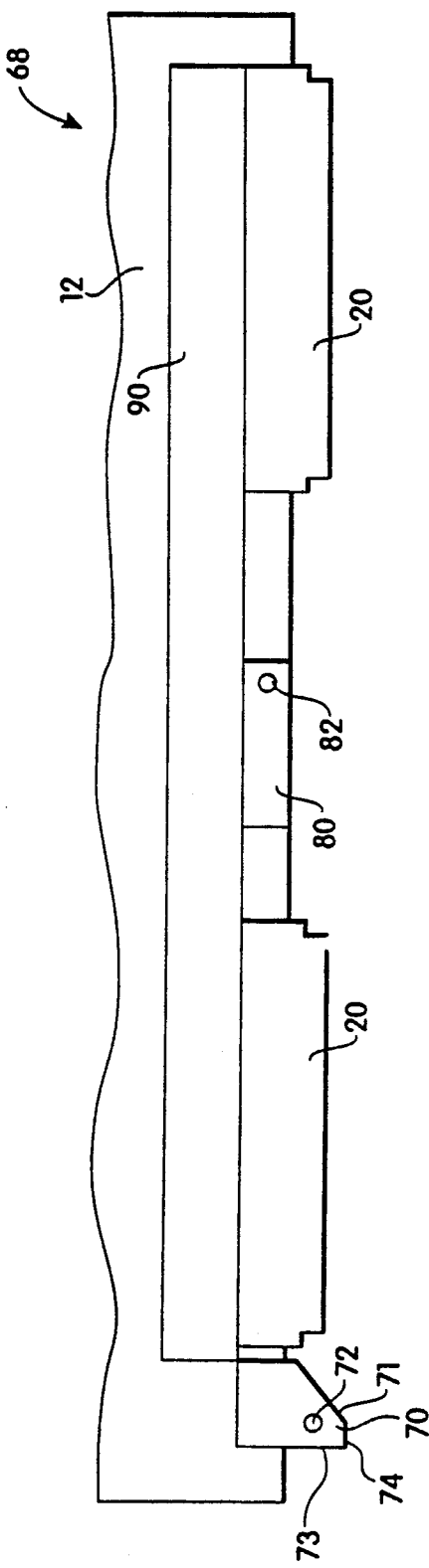

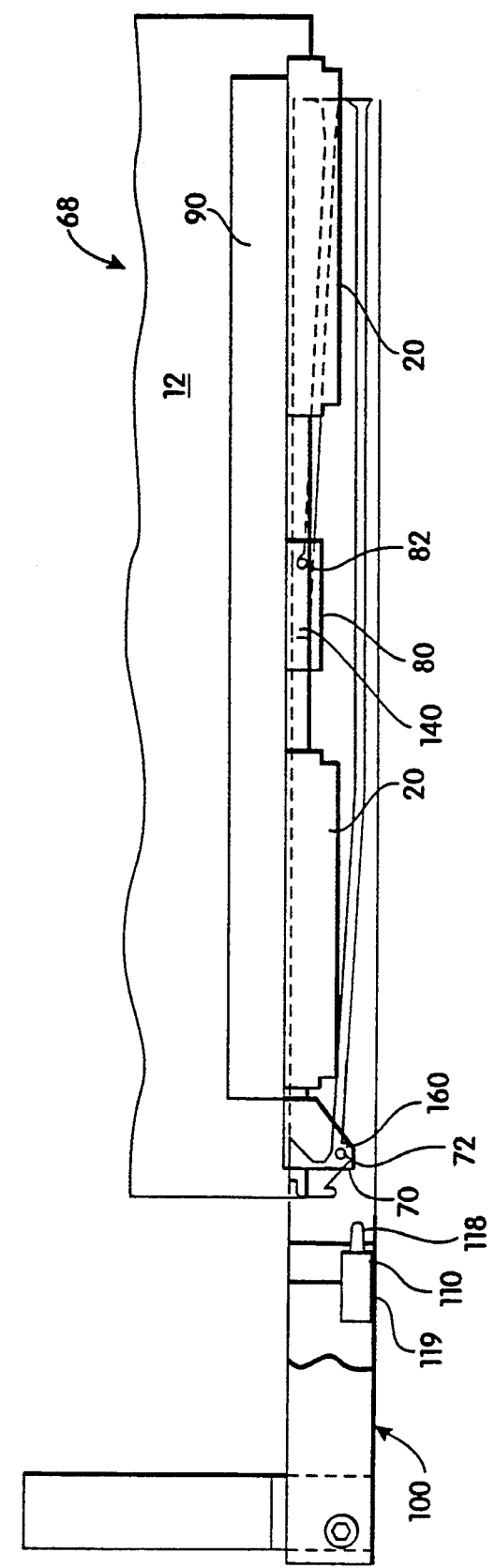

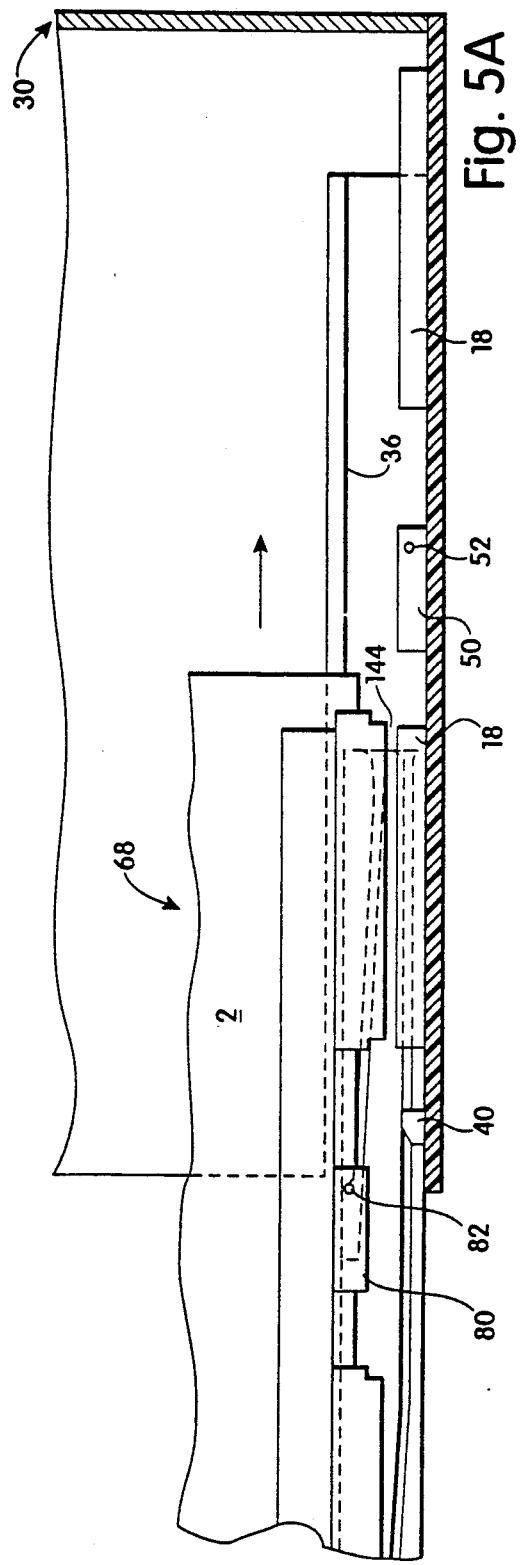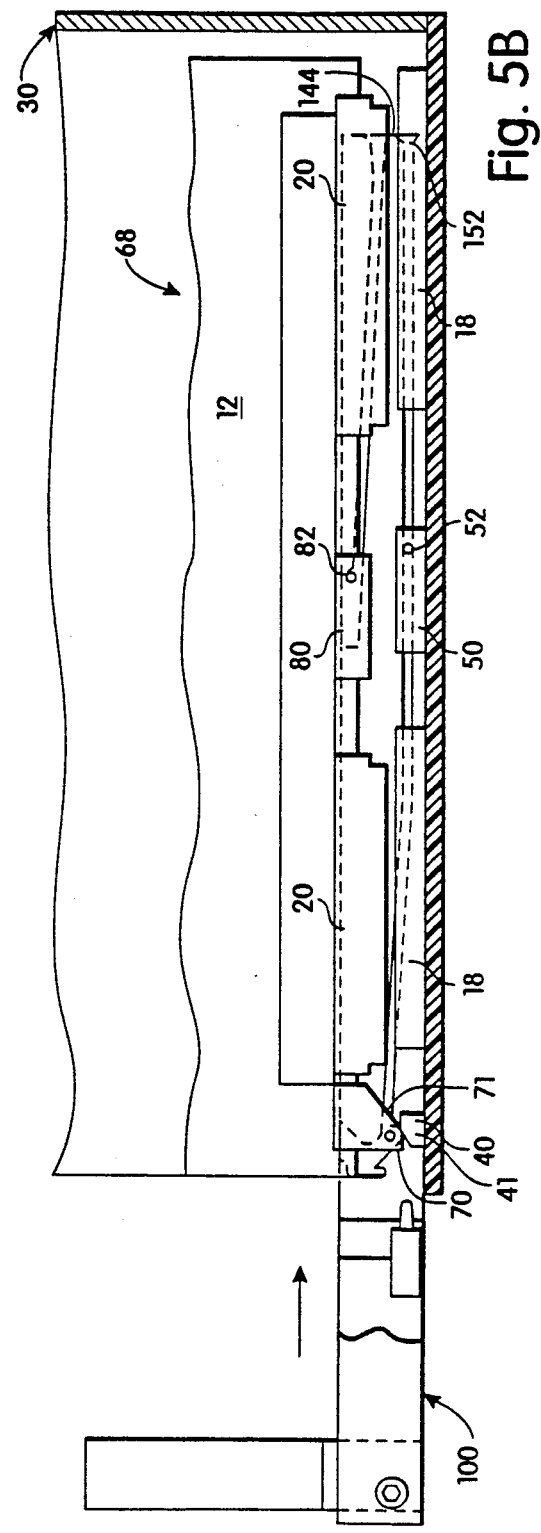

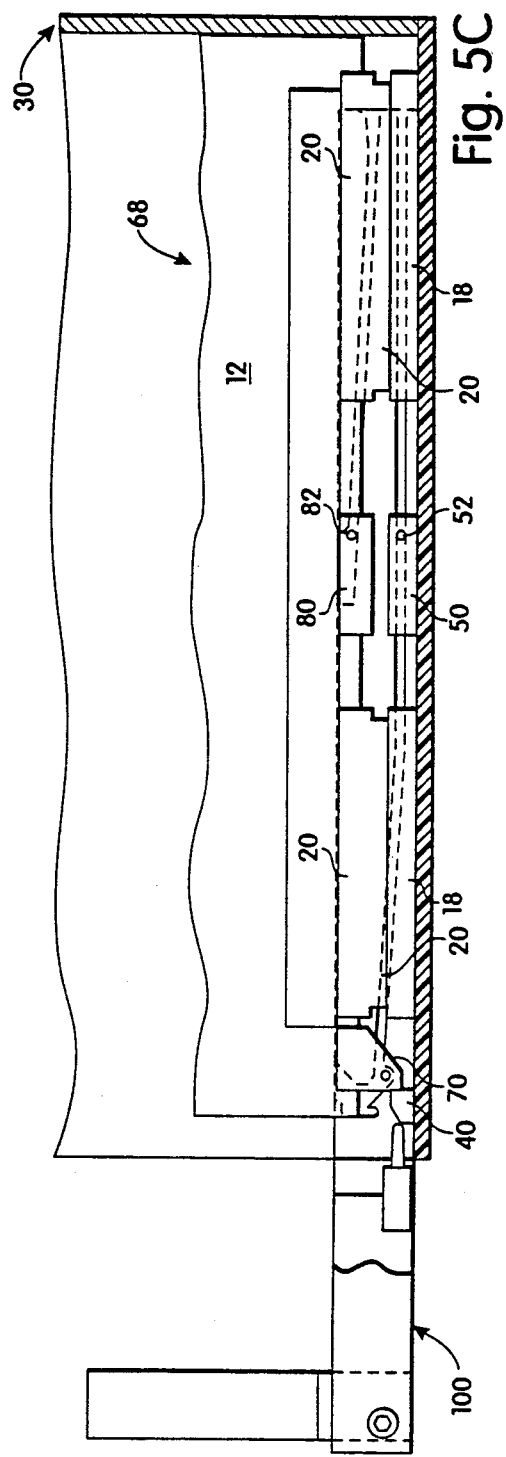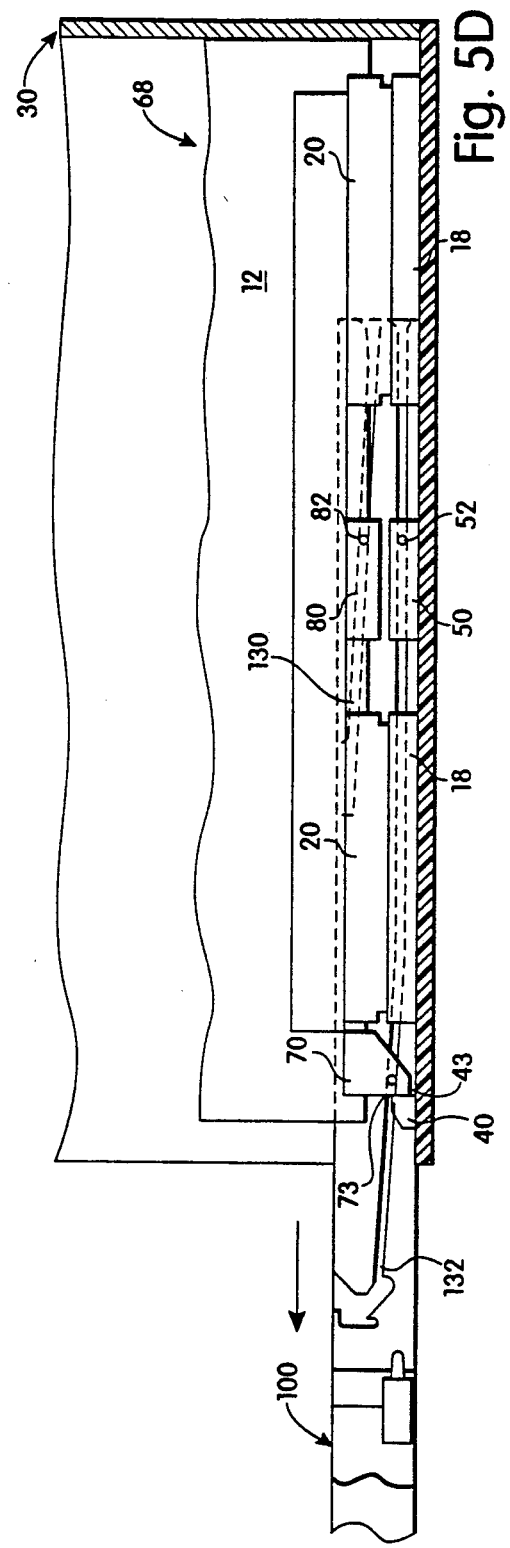

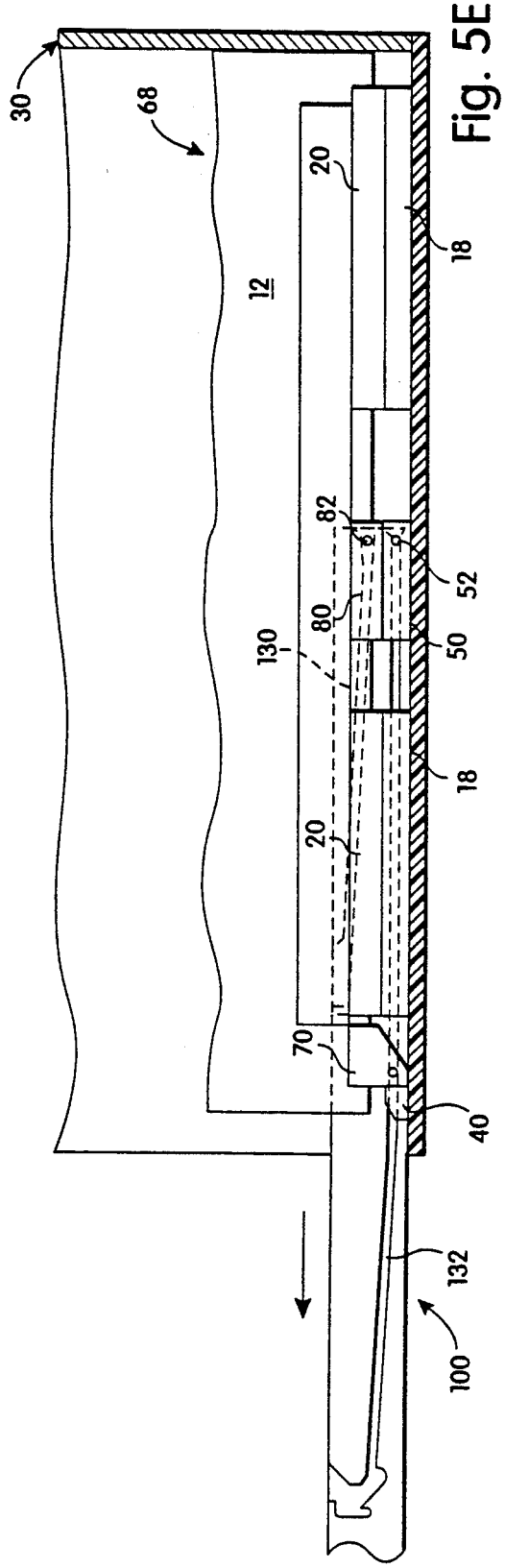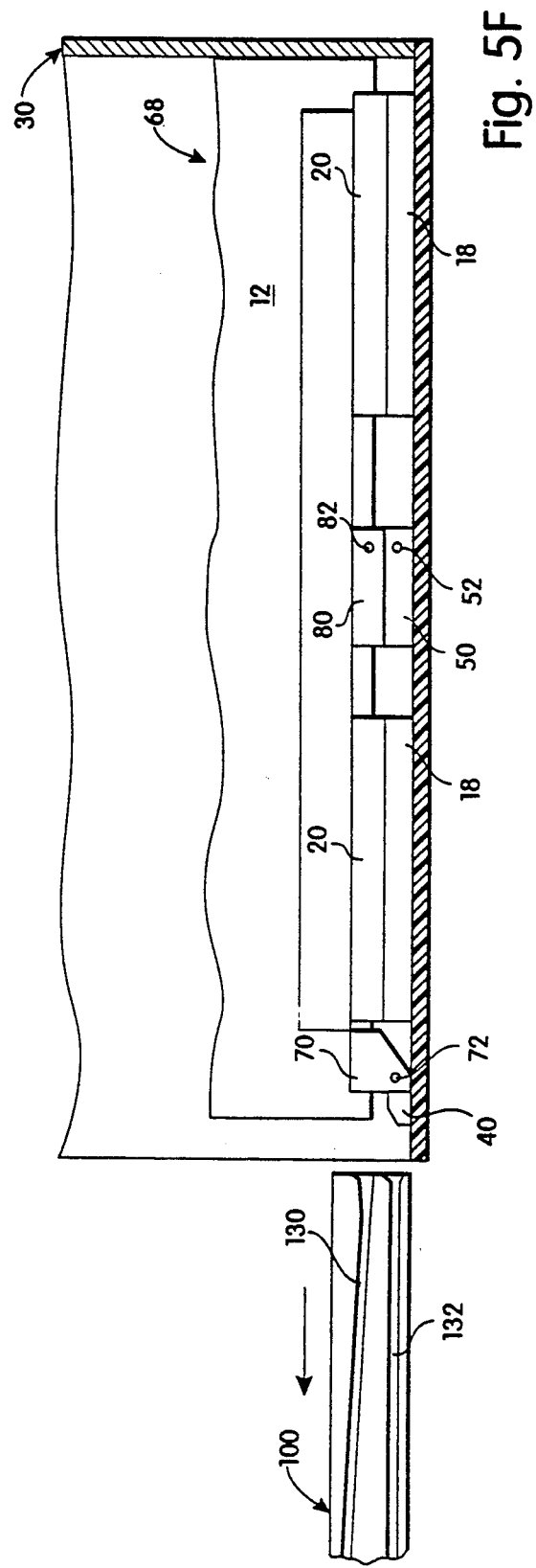

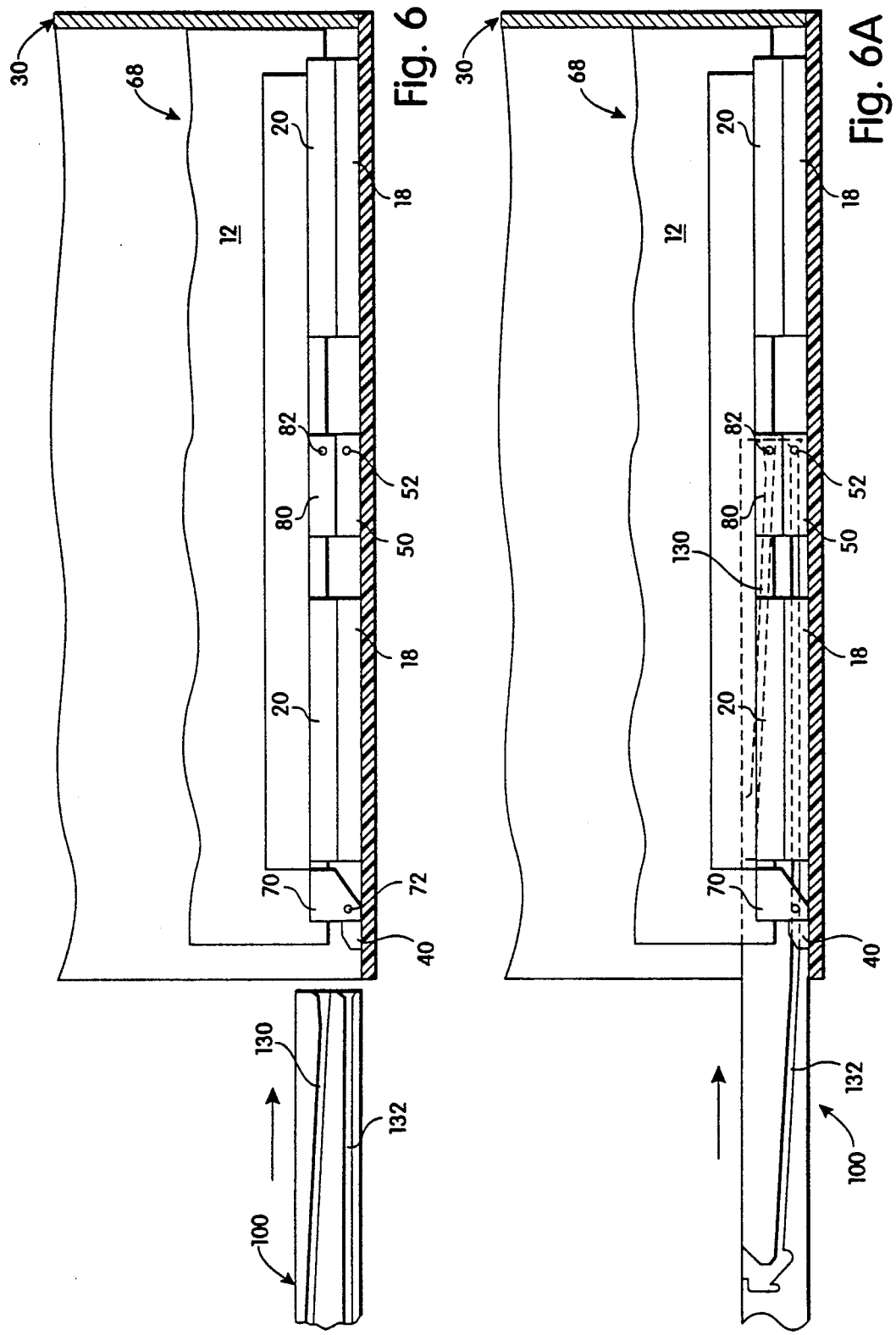

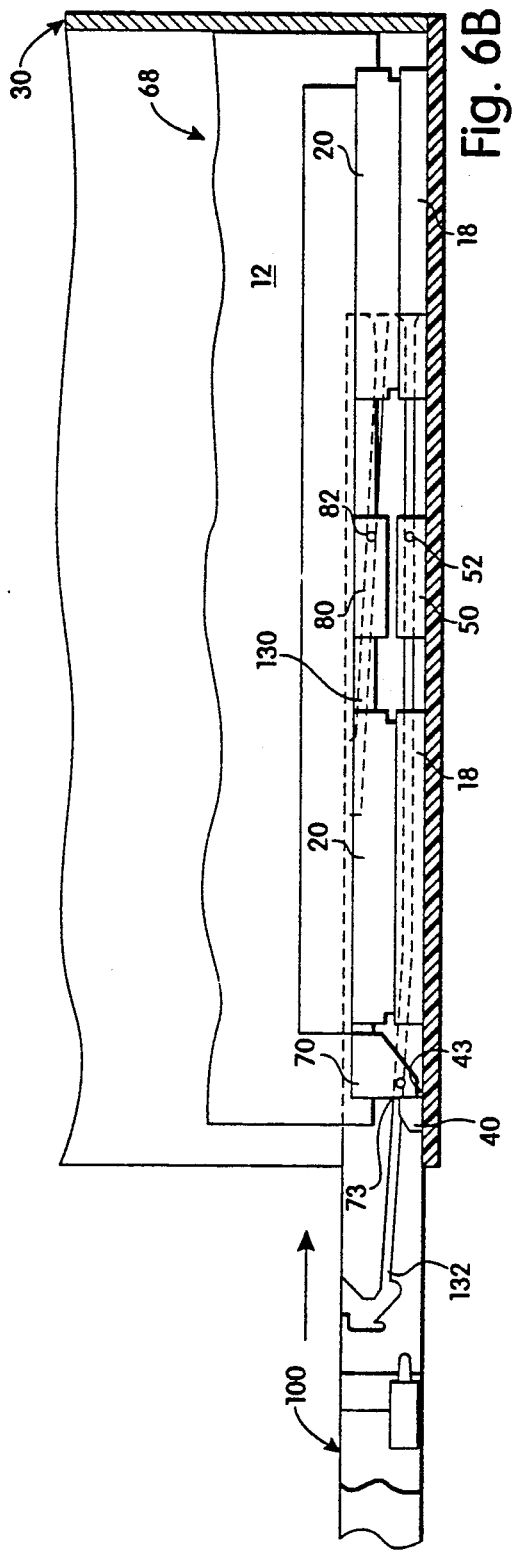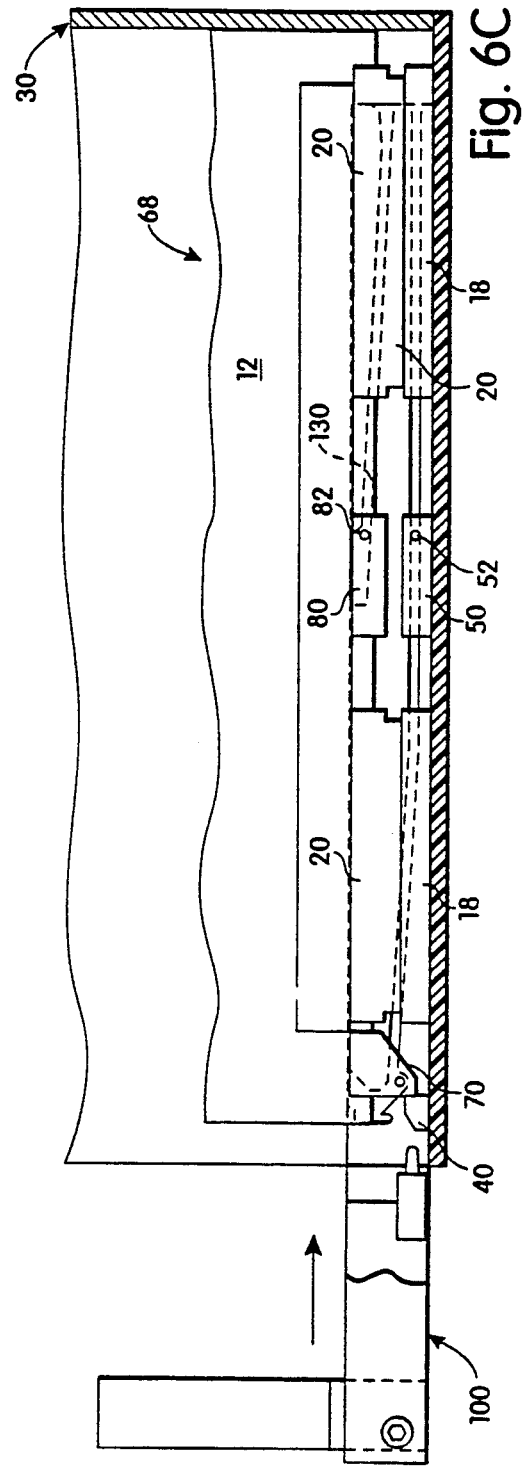

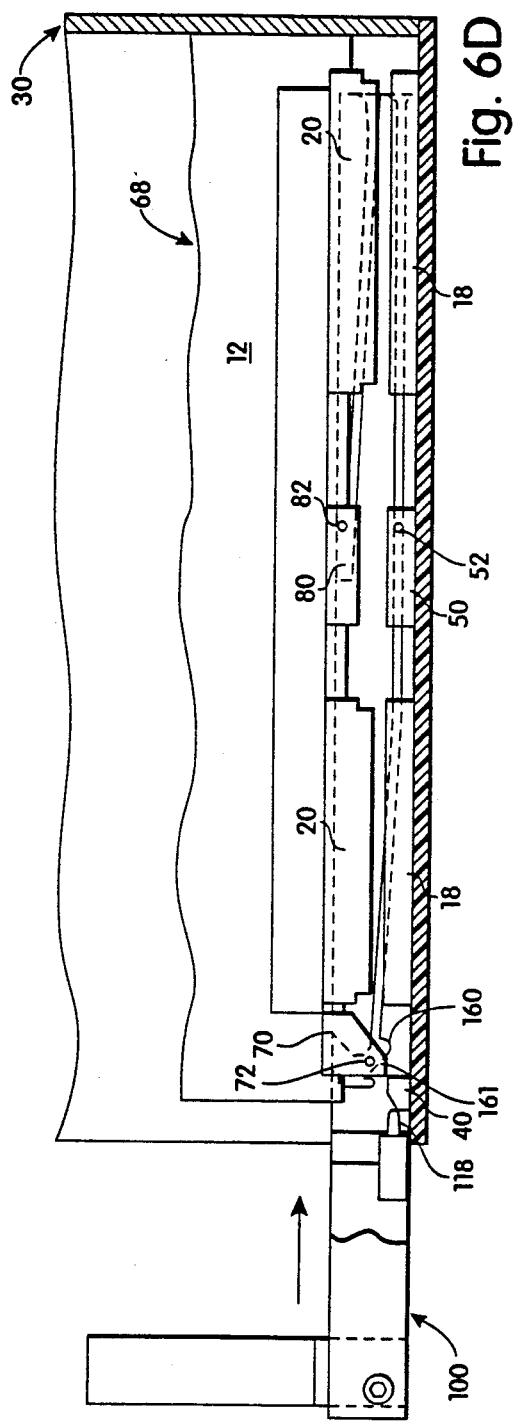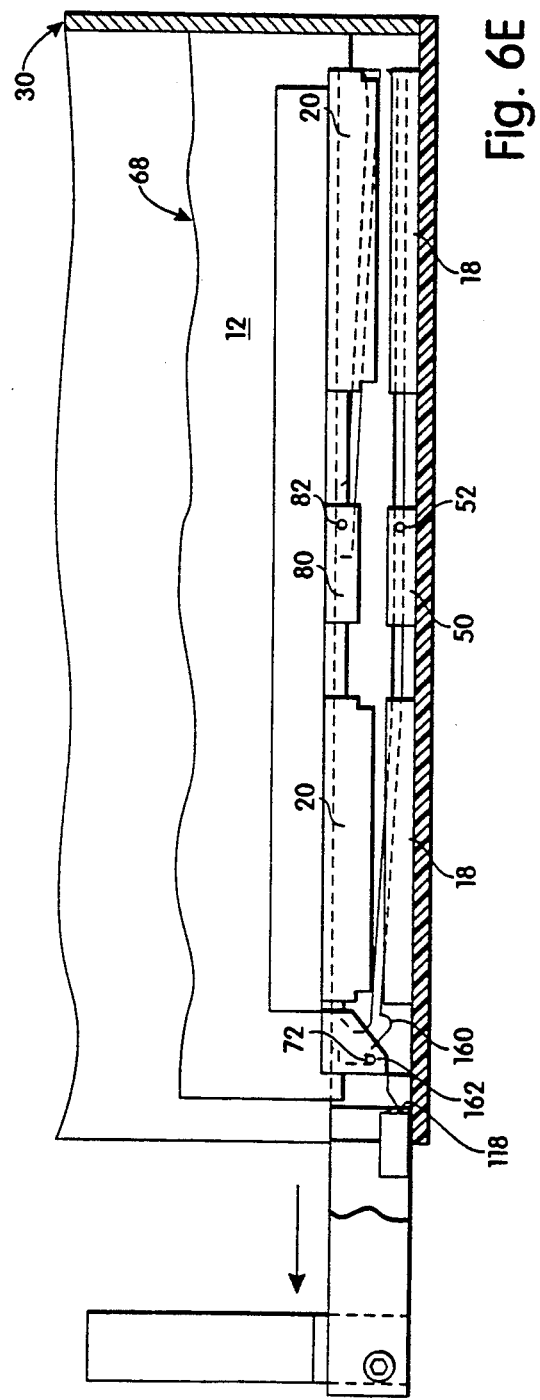

CIRCUIT BOARD AND INSERTION TOOL

RELATED APPLICATION

This application is a division of application Ser. No. 07/860,191, filed Mar. 26, 1992, now U.S. Pat. No. 5,238,423, which is a continuation-in-part of abandoned application Ser. No. 07/715,102, filed Jun. 13, 1991.

FIELD OF THE INVENTION

This invention relates to the field of packaging of electronic devices, and more particularly to the field of printed circuit boards and motherboards.

BACKGROUND OF THE INVENTION

Referring to FIG. 1, in a large general purpose computer system, the large number of electronic components 10 which make up the computer system generally requires that the components be arranged on more than one printed circuit board 12. Typically these printed circuit boards 12 are arranged in parallel within a card cage 14. Tracks 17 within the card cage 14 guide the printed circuit board 12 during the insertion of the board into the card cage 14.

One end of the card cage 14 is closed by a motherboard 16 upon which connectors 18 are located. The connectors 18 supply electrical power and ground connections to each of the printed circuit boards 12 and permit each of the printed circuit boards 12 to communicate with other printed circuit boards 12. Each printed circuit board 12 has an edge connector 20 containing a set of contact pins 21 located on the edge of the printed circuit board 12 which bring electrical power, ground and signals to the electronic components 10 on the board 12. Each edge connector 20 on each printed circuit board 12 mates with one of the connectors 18 on the motherboard 16. Generally the motherboard 16 is located opposite the opening in the card cage 14 in through which the circuit boards 12 are inserted. The pins in the motherboard connector 18 are oriented in the direction of insertion of the printed circuit board 12. Each of the individual pins 21 in the edge connector 20 on the printed circuit board 12 mates with a corresponding pin within the motherboard connector 18. The pins within the motherboard connector 18 are constructed to tightly grip the pins 21 on the edge connector 20 and a good deal of force is required to mate the pins 21 on the edge connector 20 with the pins in the motherboard connector 18. This force is directed down onto the circuit board during insertion and causes undesirable bowing and related stress to the electrical leads and components that increases the risk of failure.

The force used in inserting the edge connector pins 21 into the motherboard connector 18 also causes the pins of the connector 18 to rub against the pins 21 of the edge connector 20 and thereby remove or wipe any oxide from the pins 21 and the pins of the motherboard connector 18. In so doing, this action provides better electrical contact between the pins 21 of the edge connector 20 and the pins in the motherboard connector 18. The use of such motherboard connectors and circuit board edge connectors permits the circuit boards 12 to be removed and replaced easily.

In addition, each circuit board 12 may have an insertion/removal lever 24,25 located at each outer corner of the board 12. One end of the top lever 24 engages the upper surface of the cage 14, while one end of the bottom lever 25 engages the lower surface of the cage 14. These levers 24, 25 aid in forcing the pins 21 of the edge connector 20 into the motherboard connector 18 during circuit board 12 insertion and in pulling the pins 21 of the edge connector 20 from the motherboard connector 18 during circuit board 12 removal. The top and the bottom surfaces of the card cage 14 typically also have slots 22 through which air flows vertically (arrows A and A') to cool the components 10 on the boards 12.

While the arrangement just described is used to mate a board 12 to a motherboard 16 whose connector pins 18 are oriented in the direction of insertion, a different arrangement permits a circuit board 12 to be inserted into the card cage 14 in a direction perpendicular to the orientation of the pins of the connector 18. Generally such an arrangement is used to permit air to flow horizontally along the length of the board rather than vertically along the height of the board.

Such a horizontal air flow is important when multiple card cages are stacked vertically. With a vertical arrangement of card cages, hot air, from the card cages below, is forced through the card cages above, resulting in less cooling to the circuit boards in the upper card cages. Vertical tiers of horizontal motherboards allow fresh, cool air flow to be directed across each stack of cards in their cages.

This form of circuit board insertion is typically accomplished using a zero-insertion-force (ZIF) connector. A ZIF connector is constructed to be opened prior to circuit board insertion so as to increase the space between the pins of the motherboard connector. This permits the edge connectors 20 of the circuit board to be slid between the pins of the motherboard connectors 18. Once the circuit board 12 has been slid into the space between the motherboard connector pins, the connector is closed bringing the pins of the motherboard connector into contact with the pins 21 of the edge connector 20. However, since the pins 21 of the edge connector 20 do not rub against the pins of the motherboard connector during insertion, any oxide which has been formed on the pins remains and thereby decreases the reliability of the connection.

SUMMARY OF THE INVENTION

The invention disclosed herein relates to a system for inserting a circuit board edge connector into a motherboard connector typically with restricted space above it, wherein the pins of the motherboard connector are oriented orthogonal to the direction in which the board must first be moved into place before insertion. Insertion of and electrical coupling of the pins then takes place through the application of a force that draws the circuit board into the motherboard using a mechanical advantage achieved by the components of an insertion tool system that are in part associated with the motherboard in part with the circuit board. The forces of drawing the boards together avoids the application of undesirable bowing forces to the motherboard. A reversal of the insertion process allows withdrawal of the circuit board by first disconnecting the respective connectors by forcing the circuit board away from the motherboard without bowing the boards and then providing a path making it possible to move the circuit over the face of the motherboard until it exits the restricted area.

In one embodiment the system utilizes a tool that slides along the motherboard including a force transfer ramp cooperating with circuit board located pins for transferring force applied to the circuit board in the direction of circuit board insertion into force applied between the circuit board and motherboard in a direction to force the pins of the motherboard connector to mate with the pins of the circuit board connector.

A second embodiment of the system includes sliding rail and groove assemblies, one associated with each of the circuit board and motherboard and incorporates a bell crank mechanism to apply insertion and removal forces through the rail and groove between the circuit board and motherboard in a direction to couple the pins of the circuit board connector into the pin sockets within the motherboard connector. Both implementations provide wiping action.

In yet another embodiment the system includes a circuit board incorporating a spacer and a cardcage incorporating a spacer track which permits increased utilization of the circuit board surface for the placement of components.

BRIEF DESCRIPTION OF THE DRAWINGS

Other features and benefits of the invention can be more clearly understood with reference to the specification and the accompanying drawings in which:

FIG. 2A is a sectional view through section B—B' of the embodiment of the card cage and motherboard of FIG. 2;

FIG. 3A is a side view of the embodiment of the circuit board of FIG. 3;

FIGS. 5-5F depict the series of steps used to insert the embodiment of the circuit board shown in FIG. 3 into the embodiment of the card cage and motherboard of the embodiment of FIG. 2;

DESCRIPTION OF THE PREFERRED EMBODIMENTS

The present invention contemplates a circuit board insertion and removal tool which permits insertion and removal in cramped overhead cages and in environment allowing good air circulation for cooling and further applies the insertion and removal forces directly between the male and female connector assembling to avoid board distortions.

Figure 1:
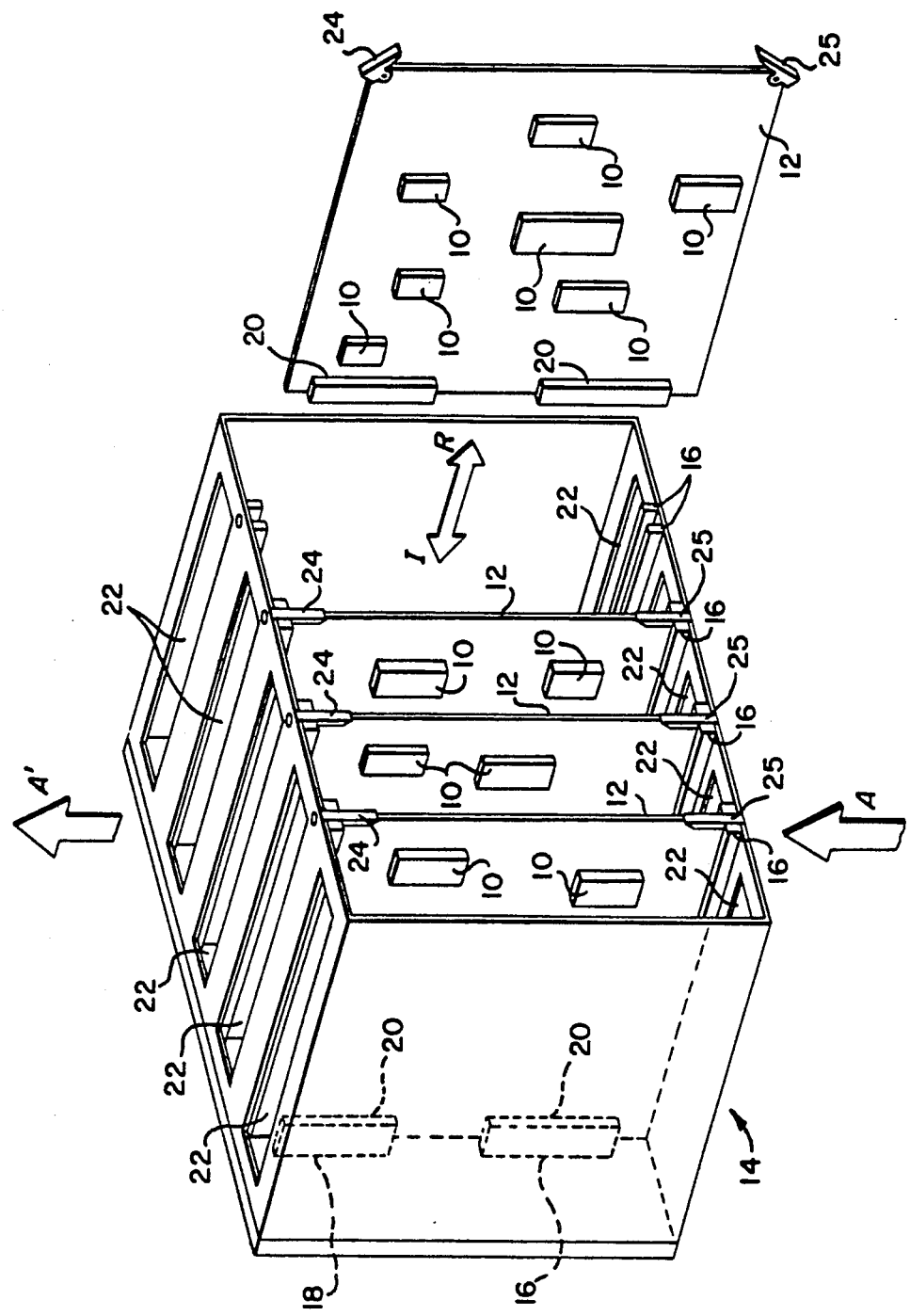
FIG. 1 is a perspective view of a card cage and circuit board known to the prior art.
Figure 2:
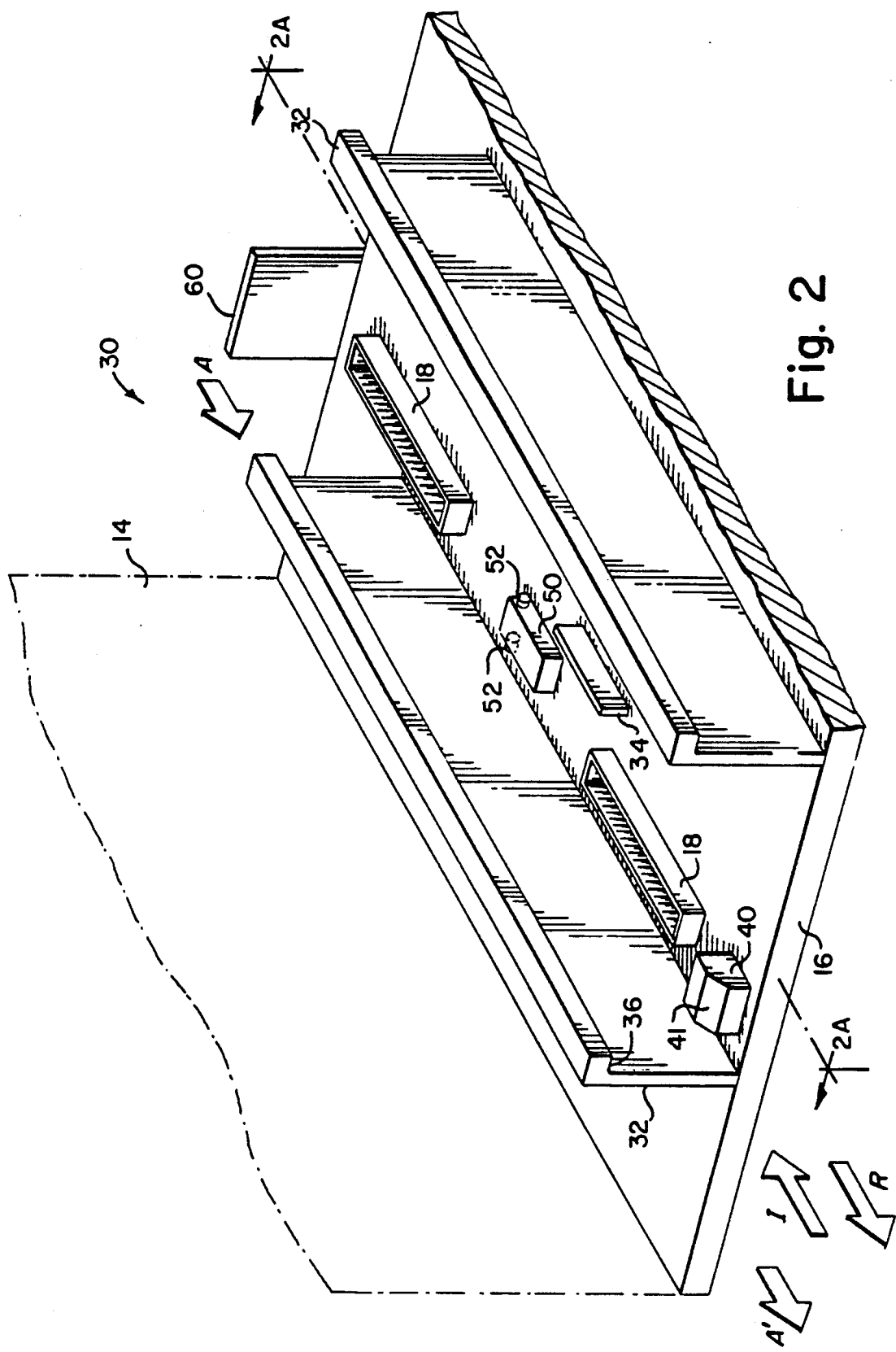
FIG. 2 is a perspective view of an embodiment of a card cage and motherboard of the invention.

A first embodiment of the removal-insertion tool with an exemplary card cage, motherboard and printed circuit board, is shown with reference to FIGS. 2 and 2A. The card cage and motherboard assembly 30 includes a card cage 14 (shown in phantom) and a motherboard 16. In the embodiment shown, the motherboard 16 is positioned at the bottom surface of the card cage 14. However, this is exemplary only and the motherboard 16 may alternatively be positioned at the top or side surfaces of the card cage 14, while utilizing the invention to facilitate vertical as opposed to a preferred horizontal air flow. The motherboard 16 is constructed in the standard fashion, with several additional structures being used in aligning and inserting a printed circuit board. The motherboard may be closely spaced for high density packaging so that insufficient space is provided for using the approach of FIG. 1.

A first tool alignment guide 32 having a lip 36 is positioned on the motherboard 16 and along one side of the connectors 18. The first tool alignment guide 32 serves to direct the circuit board removal-insertion tool during circuit board 12 insertion (Arrow I) and removal (Arrow R). Positioned on the other side of the connectors 18 from the first tool alignment guide 32 and approximately midway between the connectors 18 is a second tool alignment guide 34. The second alignment guide 34 constrains the circuit board removal-insertion tool to move along the first tool alignment guide 32 during circuit board removal and insertion.

A forward retaining member 40, located toward the opening of the card cage 14 and laterally aligned approximately with the connectors 18, serves to retain the circuit board 68 during board insertion. A vertical alignment member 50, having a pair of alignment pins 52, one on each side, is located between the connectors 18, and serves to constrain the circuit board insertion and removal tool to move along the surface of the motherboard 16. A rear stop 60 provides a positive stop for the motion of the circuit board 12 during board removal.

This form of card cage and motherboard makes possible the horizontal flow of air of homogeneous temperature from back to front through the card cage. Such air flow is important when multiple card cages are to be stacked in a vertical configuration. In this way, a source of air may be placed along the back of each card cage and the movement of air from back to front (Arrows A,A' in FIG. 2) insures each card cage will be cooled substantially equally.

Figure 3:
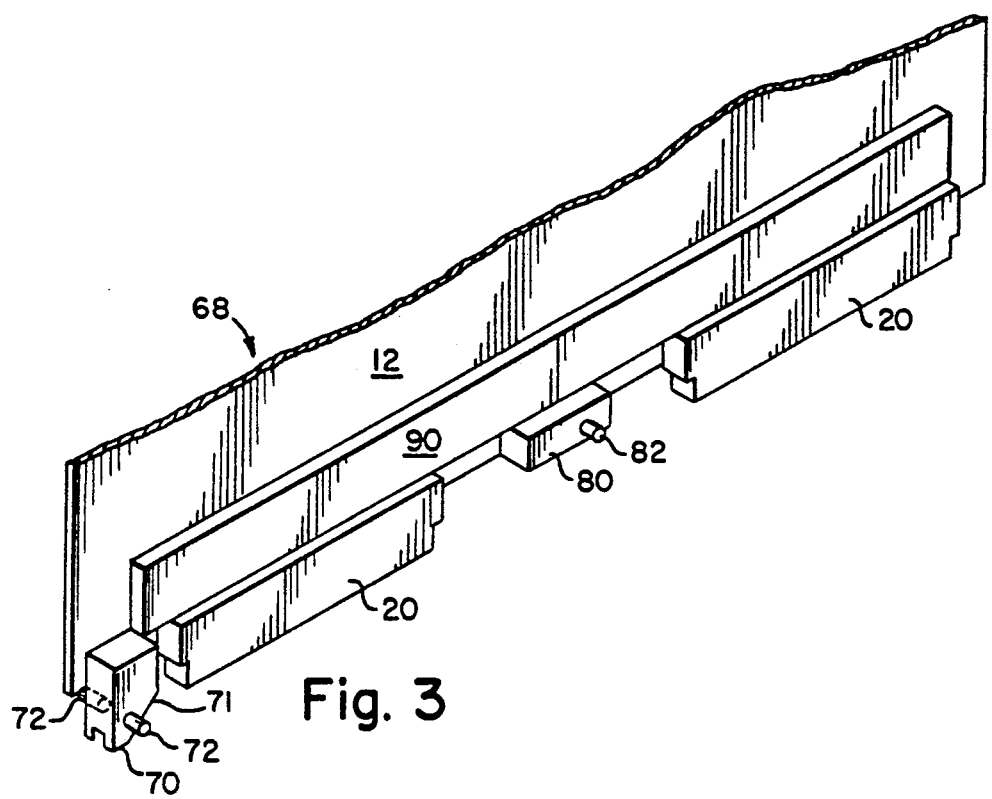
FIG. 3 is a perspective view of an embodiment of a circuit board of the invention.

Referring to FIGS. 3 and 3A, an embodiment of a circuit board 68 constructed in accordance with the invention includes a printed circuit board 12 having edge connectors 20. The edge connectors 20 are positioned on the edge of the printed circuit board 12 and spaced apart so as to mate with the motherboard connectors 18. At the bottom front edge of the circuit board 68 is positioned a front force transfer member 70 having a pair of force transfer pins 72, extending one on each side. Approximately midway between the edge connectors 20 is located a rear force transfer member 80 having a pair of force transfer pins 82, again one extending from each side. The forward and rear force transfer members 70,80 convert forward horizontal motion of the circuit board 68 into downward vertical motion during board insertion and into upward vertical motion during board removal. The front force transfer member 70 extends below the rear force transfer member 80 and the force transfer pins 72 are positioned below the height of the force transfer pins 82. A circuit board reinforcement bar 90 is positioned near the lower edge of the circuit board 68, above the edge connectors 20 and serves to prevent board flexing during board insertion and removal.

Figure 4:
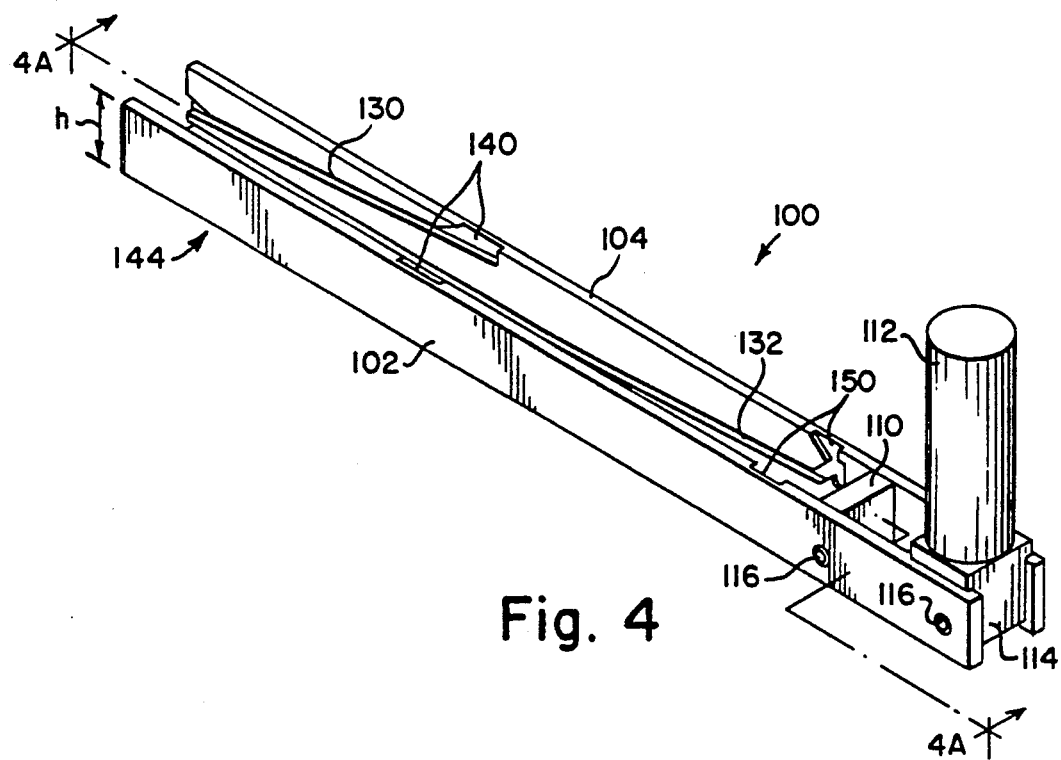
FIG. 4 is a perspective view of an embodiment of a tool used to insert the embodiment of the circuit board shown in FIG. 3 into the embodiment of the card cage and motherboard shown in FIG. 2.
Figure 4A:
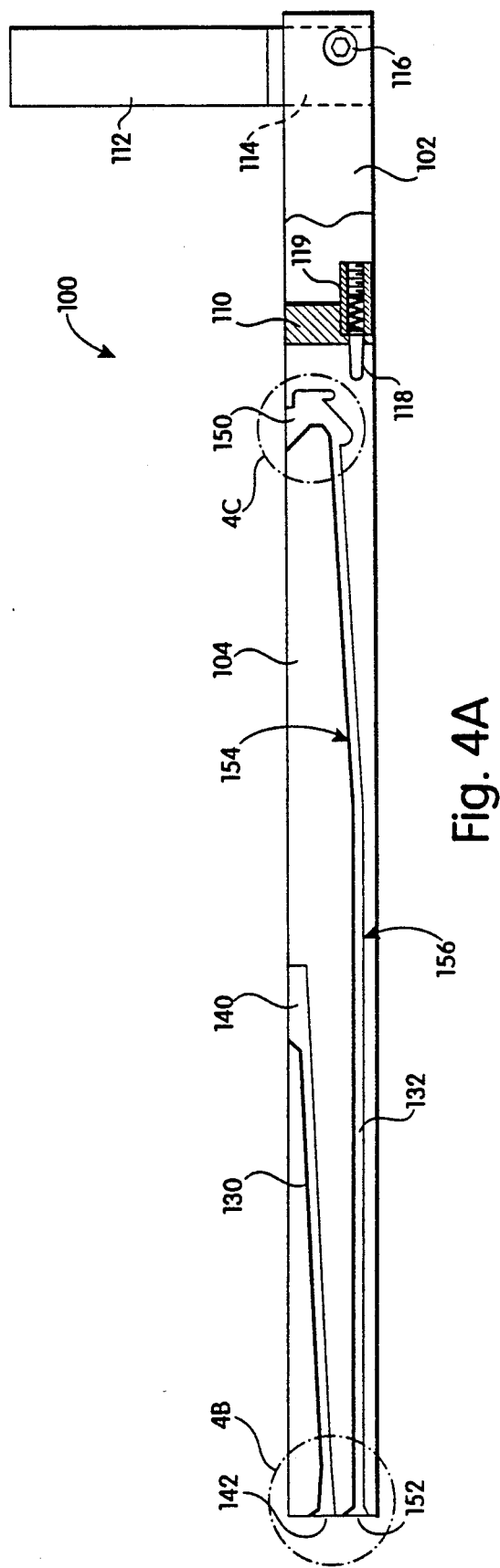
FIG. 4A is a sectional view of the embodiment of the tool of FIG. 4 taken through section C—C' of FIG. 4.
Figure 4C:
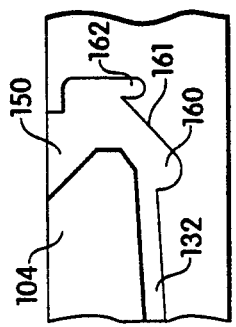
FIG. 4C is an enlarged view of region C of the embodiment of the tool shown in FIG. 4.
Figure 4B:
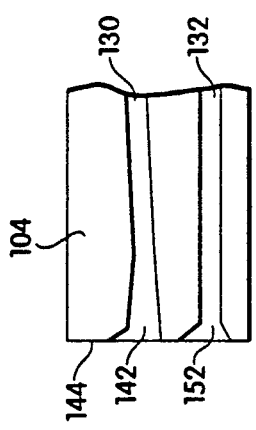
FIG. 4B is an enlarged view of region B of the embodiment of the tool shown in FIG. 4.

Referring now to FIGS. 4–4C, an embodiment of the circuit board removal insertion tool 100 in accordance with the invention includes a left 102 and a right 104 linear support member. The left 102 and right 104 linear support members are separated by a spring retaining member 110 located near one end of the linear support members 102,104. The spring retaining member 110 holds a bumper 118 biased by a spring 119 away from the spring retaining member 110. The bumper 118 pushes the circuit board 68 along during board insertion. The linear support members 102,104 are separated sufficiently so as to permit the forward retaining member 40, the vertical alignment member 50, and the connectors 18 of the motherboard 30 and the forward force transfer member 70, the rear force transfer member 80 and the edge connectors 20 of the circuit board 68 to pass between the linear support members 102,104 during board removal and insertion, while still permitting the linear support members 102,104 to move between the first 32 and second 34 tool alignment guides. The height of the linear support members 102,104, indicated by the dimension "h", is such that the left linear support member 102 can fit between the lip 36 of the first tool alignment guide 32 and the motherboard surface. These dimensions permit the tool 100 carrying the circuit board 68 to be moved along the surface of the motherboard 16 while insuring the proper alignment of the circuit board connectors 20 and the motherboard connectors 18 during board insertion.

Adjacent the spring retaining member 110 and at the same end of the linear support members 102,104 is a handle assembly 112 projecting at approximately ninety degrees to the linear support members 102,104. The base of the handle assembly 114 and the spring retaining member 110 are secured to the linear support members 102,104 by bolts 116.

Each of the linear support members 102,104 includes a pair of slots 130,132. Considering only the right linear support member 104 and remembering that the same structure exists in the left linear support member 104, the first slot 130 begins approximately midway along the linear support member 102 in a first receiving groove 140. The first receiving groove 140 is located at the top surface of the linear support member 104. The first slot 130 slopes toward the front edge 144 of the linear support member 104 and terminates in a first locating groove 142 positioned at about the middle of the front edge 144.

The first receiving groove 140 is positioned so as to receive one of the force transfer pins 82 of the rear force transfer member 50 as the circuit board 68 is loaded in the tool 100 at the start of board insertion. During board insertion, the force transfer pin 82 moves, relative to the tool 100, from the first receiving groove 140 through the slot 130 through the first locating groove 142. During board removal, the first locating groove 142 helps align the force transfer pin 82 of the rear force transfer member 80 with the first slot 130 and the force transfer pin 82 moves, relative to the tool 100, from the first locating groove 142 through the slot 130 to the first receiving groove 140.

The second slot 132 begins in a second receiving groove 150 located at the upper surface of the linear support member 104 approximately adjacent the spring retaining member 110. The second slot 132 generally slopes toward the front edge 144 of the linear support member 104. The second slot 132 terminates in a second locating groove 152 at the front edge 144 of the linear support member 102 below the first locating groove 142. The second receiving groove 150 opens into a complex structure which will be discussed in more detail below. The second receiving groove 150 is located so as to receive one of the force transfer pins 72 of the front force transfer member 70 as the circuit board 68 is loaded in the tool 100 at the start of board insertion. The force transfer pins 72,82 extend from the force transfer members 70,80 sufficiently to engage the slots 132,130, while permitting the force transfer members 70,80 to pass between the linear support member 102,104.

During board insertion, the force transfer pin 72 moves relative to the slot 132, from the second receiving groove 150 along the slot 132 through the second locating groove 152. During board removal, the force transfer pin 72 moves, relative to the slot 132, from the second locating groove 152 to the second receiving groove 150. During both board insertion and removal, the second locating groove 152 helps align and engage both the force transfer pin 72 of the front force transfer member 70 and the alignment pin 52 of the vertical alignment member 50 with the second slot 132.

In more detail, the receiving groove 150 opens into an insertion groove 160 and a removal groove 162. The insertion groove 160 supports the force transfer pins 72 during board insertion and the removal groove 162 supports the force transfer pins 72 during board removal. These grooves 160,162 communicate with a sloping portion 154 of the slot 132. The sloping position 154 of the slot 132 in turn communicates with a horizontal portion 156 of the slot 132, which opens into the second locating groove 152.

Referring to FIGS. 5–5D, to engage a circuit board 68 with the 13 motherboard 30, the circuit board 68 is first mounted in the tool 100 by placing the circuit board 68 between the two linear support members 102,104 and engaging the force transfer pin 72 on each side of the front force transfer member 70 with the insertion groove 160 of the second receiving groove 150 in the linear support members 102,104. Similarly, each force transfer pin 82 on each side of the rear force transfer member 80 engages with the first receiving groove 140 in the linear support members 102,104. With the board 68 thus engaged, the circuit board 68 is carried by the tool 100 into position with the motherboard 30 (FIG. 5).

Referring to FIG. 5A, the front edge 144 of the left support member 102 of the tool 100 is positioned to slide below the lip 36 of the tool alignment guide 32. The tool 100 is oriented such that the forward retaining member 40 and the forward connector 18 are positioned between the two linear support members 102,104. As the front edge 144 of tool 100 is moved toward the center of the motherboard 30 (FIG. 5B), the vertical alignment member 50 also is positioned between the linear support members 102,104, and the second locating groove 152 engages the alignment pins 52 of the vertical alignment member 50.

Referring to FIG. 5C, as the tool 100 is moved further forward the front force transfer member 70 rides over the forward retaining member 40, owing to the sloping engagement surfaces 41,71 on each member. When this occurs, the circuit board connectors 20 are aligned with the motherboard connectors 18 and the rear force transfer member 80 is aligned with the vertical alignment member 50.

Referring to FIG. 5D, the tool 100 is then moved backward, out of the card cage and motherboard 30. The vertical surface 73 of the front force transfer member 70 is prevented from moving backward along with the tool 100 by the vertical surface 43 of the forward retaining member 40. The engagement of these surfaces 43,73 retains the circuit board 68 within the card cage and motherboard 30 as the tool 100 is removed.

As the tool 100 continues to move back (FIG. 5E), the force transfer pins 72,82 of the front 70 and rear 80 force transfer members respectively, slide along the slots 132,130 respectively. The upper edge of each slot 132,130 imparts a downward component of force on each of the force transfer pins 72,82 as the tool 100 is moved backward, owing to the retention of the circuit board 68 by the forward retaining member 40. This downward component of force pushes the circuit board edge connectors 2 into the motherboard connectors 18. The slope of the sloping portion 154 of slot 132 is such that once the connectors 18,20 seat, the sloping portion 154 becomes the horizontal portion 156, permitting the force transfer pins 72 to experience no downward component of force and to slide along the slot 132 and out through the second locating groove 152. Similarly, the slope of the slot 130 is also such that once the connectors 18,20 seat, the force transfer pins 82 exit through the first locating groove 142. Once the force transfer pins 72 exit through the second locating groove 152, the tool 100 is free from the motherboard (FIG. 5F).

A feature of this arrangement is that the tool, in applying the insertion force, acts to pull the circuit board pins and the motherboard connector together with a lever action in which the fulcrum extends across the entire length of the connector. This is distinguished from the prior art in which the circuit board is pushed into the motherboard. In the prior art, the force needed to insert the card pins into the connectors on the motherboard is transferred through the printed circuit board causing the circuit board to bow and risk being damaged. The pulling together function of the present invention avoids the problem of board flexing or bowing.

To remove the circuit board 68 from the card cage and motherboard 30, the front edge 144 of the left support member 102 of the tool 100 is positioned to slide below the lip 36 of the alignment guide 32 (FIG. 6). The tool 100 is again oriented such that the forward retaining member 40 and the forward connector 18 are positioned between the two linear support members 102,104. As the front edge 144 of tool 100 is moved toward the center of the motherboard 30, the force transfer pins 72 of the front force transfer member 70 engage the second locating groove 152 and move along the horizontal portion 156 of slot 132. As the tool 100 moves forward, the vertical alignment member 50 also is positioned between the linear support members 102,104, and the second locating groove 152 engages the alignment pins 52 of the vertical alignment member 50 (FIG. 6A). At the same time, the force transfer pins 82 of the rear force transfer member 80 engage the first locating groove 142.

Referring to FIG. 6B, as the tool 100 is moved forward, the force transfer pins 72 of the front force transfer member 70 reach the sloping portion 154 of the slot 132 as the force transfer pins 82 pass through the first location groove 42 and engage the slot 130. As the tool 100 continues to move forward, the force transfer pins 72, 82 of the front 70 and rear 80 force transfer members respectively, slide along the slots 130,132 respectively. The lower edge of each slot 130,132 imparts an upward component of force on each of the force transfer pins 72,82 as the tool 100 is moved forward. This upward component of force separates the circuit board edge connectors 20 from the motherboard connectors 18. The slope of the sloping portion of slot 132 is again such that once the connectors 18,20 separate, the force transfer pins 72 move from the sloping portion 154 of slot 132 into the second receiving groove 150. Likewise, the slope of the slot 130 is such that once the connectors 18,20 separate, the force transfer pins 82 move from the slot 132 into the first receiving groove 140 (FIG. 6C).

Figure 6F:
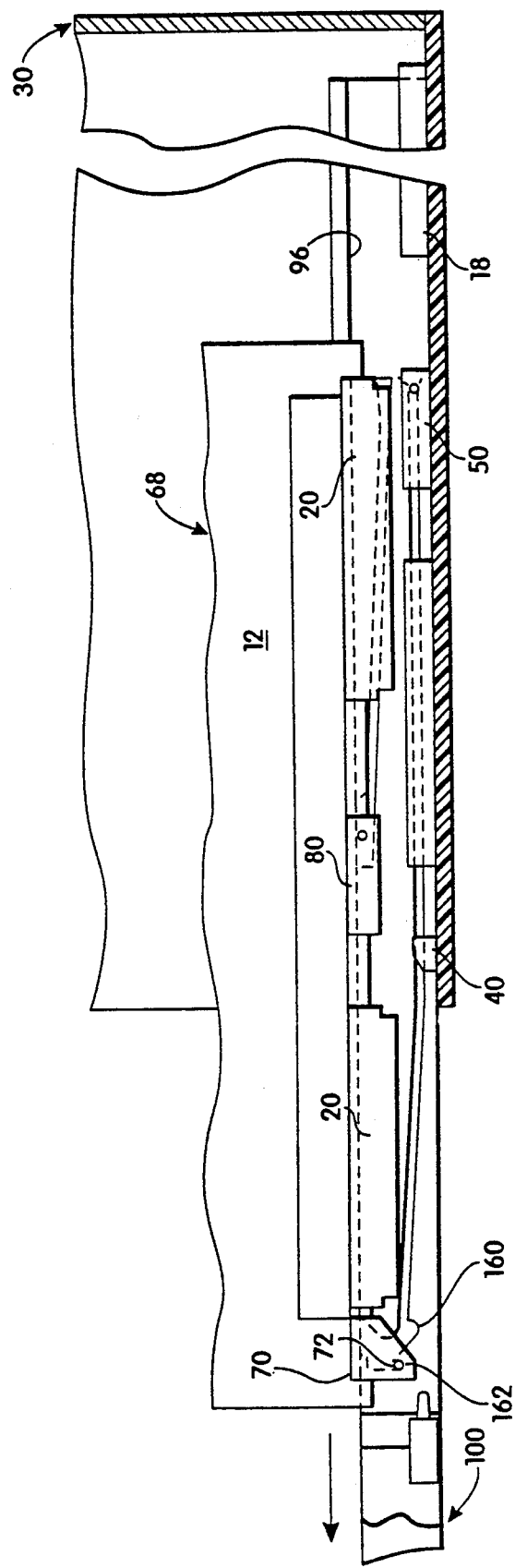
FIGS. 6-6G depict the series of steps used to remove the embodiment of the circuit board of FIG. 2 from the embodiment of the motherboard of FIG. 2.
Figure 6G:
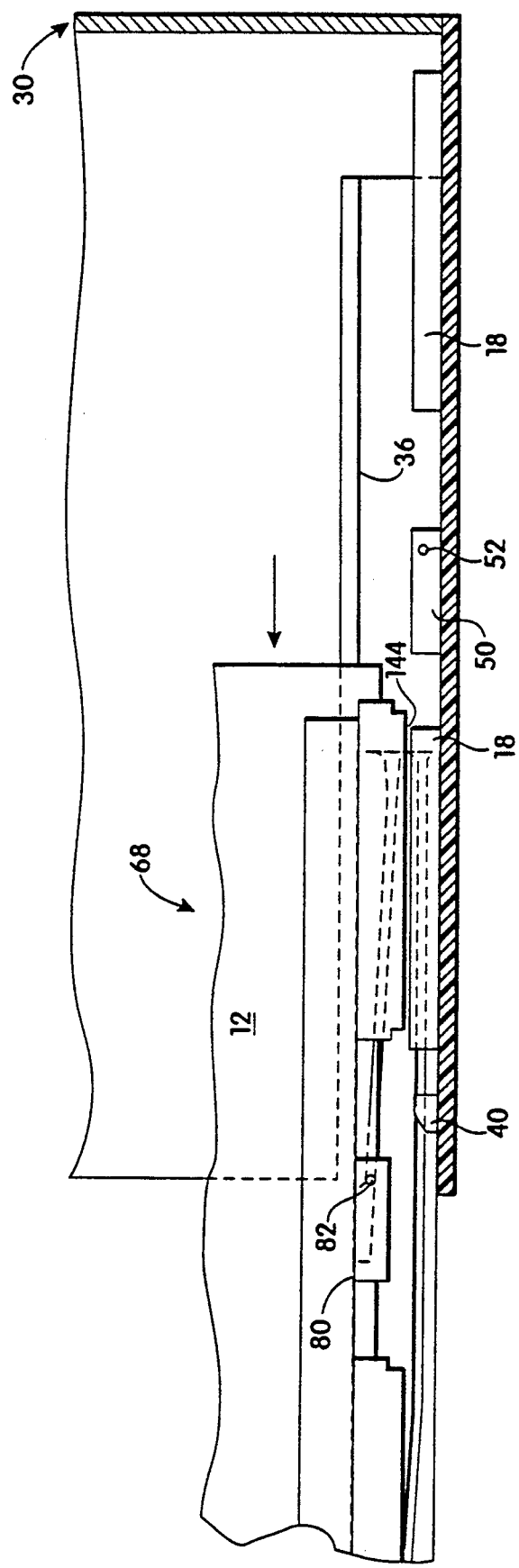

At this point the tool 100 is moved slightly further forward, causing the bumper 118 to press against the forward retaining member 40, compress the spring 119 and force the circuit board 68 against the stop 60. When the circuit board 68 can no longer move forward, the force transfer pins 72 ride up the slope 161 (FIG. 6D) from the insertion groove 160 into the retaining groove 162 (FIG. 6E). The retaining groove 162 is located sufficiently high in the support member 102,104 that the base 74 of the front force transfer member 70 is supported above the top 44 of the retaining member 40. This permits the circuit board 68 to be removed, along with the tool 100, from the motherboard (FIGS. 6F and 6G).

Once the circuit board 68 is clear of the motherboard 16, the circuit board 68 may be removed from the tool 100 by lifting the circuit board 68 and permitting the force transfer pins 72,82 to lift from the receiving grooves 150,140 respectively.

It should be noted that although the embodiment just described contemplates a tool 100 which is separate from a circuit board 68 and motherboard 30, embodiments are contemplated in which the tool 100 is attached to the circuit board 68 or motherboard 30 so as always to be available for use in inserting or removing circuit boards 68.

Figure 7:
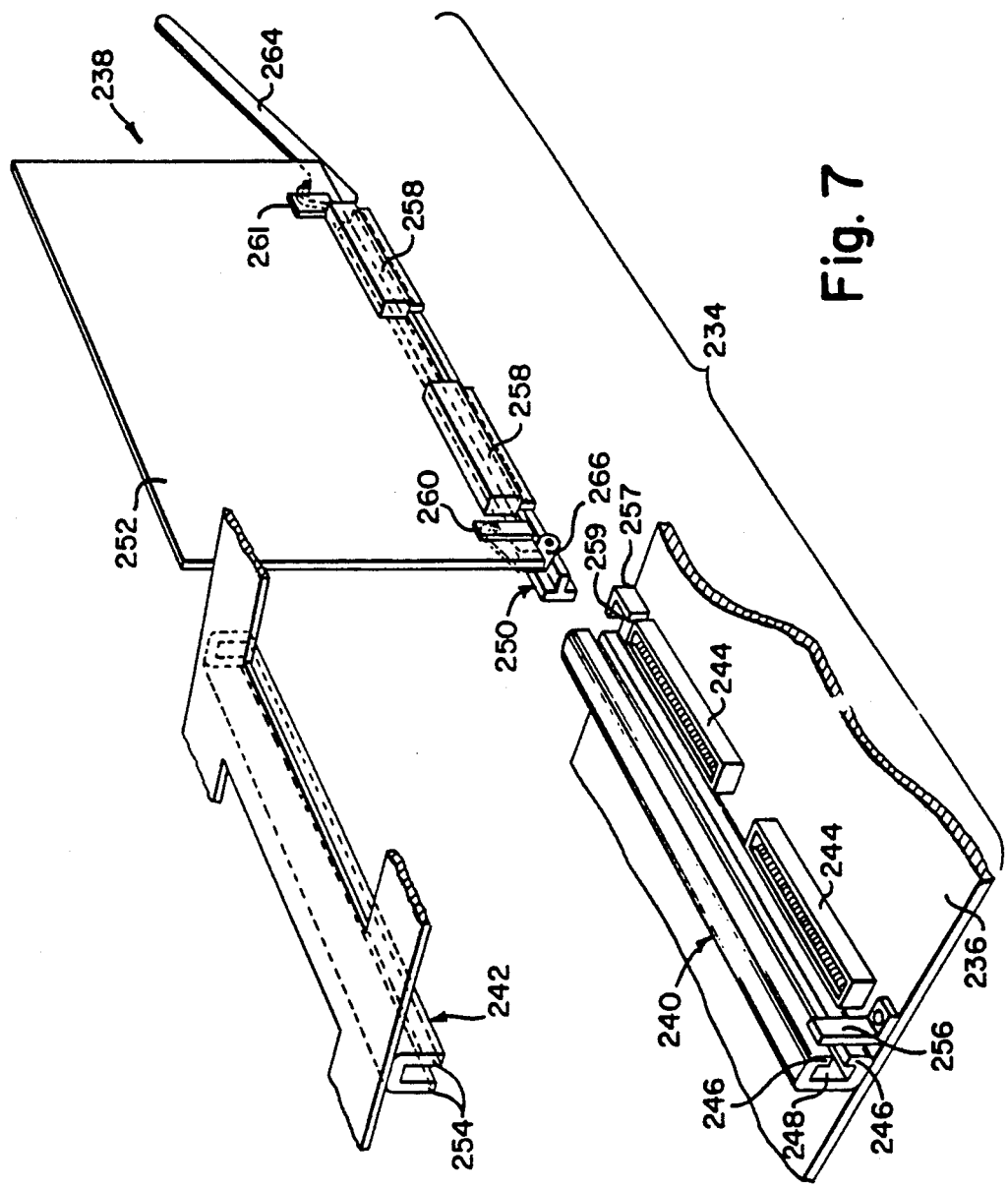
FIG. 7 is a perspective view of another embodiment of a circuit board with a sliding rail and groove assembly having a bell crank and a card cage constructed in accordance with the invention.

Another embodiment of the invention which incorporates, on the circuit board itself the mechanism to insert the circuit board edge connectors into the motherboard connectors, is depicted in FIG. 7.

Referring to FIG. 7, a further embodiment of the invention is illustrated with a card cage 234, a motherboard 236, and a circuit board 238 with a crank with lever 264 operative to raise and lower a rail 250. In this embodiment, the motherboard 236 is positioned at the bottom of the card cage 234. However, this is exemplary only and the motherboard 236 may alternatively be positioned at the top or sides of the card cage 234 in using the invention. The motherboard 236 and card cage 234 are constructed in the standard fashion, incorporating several additional structures to ensure precise alignment and stability of the circuit board with a crank 264 upon installation in the cage and mating with the motherboard.

In this embodiment, a lower grooved guide track 240 and an upper guide track 242 provide alignment of the card by accepting the rail 250 and upper card edge 252. The lower guide track 240 is positioned on or close to the motherboard 236 and along one side of the motherboard connectors 244. The lower guide track 240 has lips 246 defining an open, "T" shaped channel 248 able to receive a guide member or rail 250, which is "T" shaped to allow it to slide within the channel 248 without slipping out under insertion and removal pressures as described below. For this purpose the preferred guide member 250 is small enough to slide freely along the axis of the lower guide track 240 yet large enough to move with minimal vertical and horizontal play and be precluded from being laterally withdrawn from the channel 248.

The optional upper guide track 242 at the top of the card cage 234 aligns the circuit board 238 providing lateral stability to the top of the circuit board 252 both during insertion and removal of the board assembly 238, and while the board 238 is in place within the card cage 234.

The upper guide track 242 has two parallel walls 254 separated by sufficient distance such that the upper edge of the circuit board 252 moves freely in the channel therebetween, but close enough together so that an acceptable limit to lateral movement at the top of the circuit board 252 is obtained. The depth of the guide track 242 is sufficient to retain the circuit board 252 throughout its entire range of vertical motion during insertion and removal.

The rail 250 is separated as opposite ends from board 238 by crank 264 and a curved link 266 through pivotal connections to the circuit board 252 and the guide rail 250 to form a pivoting parallelogram. The crank lever 264 has a pin joint pivot 268 on the circuit board 252 and a second pin joint pivot 270 to rail 250. Link 266 has corresponding pivots 274 and 272. The length of the crank 264 and placement of the fulcrum pin joint 268 is such that a significant mechanical advantage is created in the application of force to the guide rail 250 from motion of the crank 264. This mechanically enhanced force is conveyed from the rail 250 to guide 240.

Approximately adjacent the back of the cage 234 a rear stop block 256 is positioned on the motherboard 236 to limit the travel of the printed circuit board 238 upon its insertion into the cage 234, by engaging a rear stop block 260 on circuit board 238. The board 238 is thus stopped with circuit board connectors 258 aligned with motherboard connectors 244 to allow the pins to be coupled without damage. The rear stop block 256 may be anchored to or a part of the cage 234.

Similarly, adjacent the front of the motherboard 236 a motherboard forward stop block 257 is positioned on the motherboard 236 to limit the travel of the printed circuit board 238 upon its removal from the cage 234, by engaging a circuit board forward stop block 261 on circuit board 238. The board 238 is thus stopped with circuit board connectors 258 aligned with motherboard connectors 244 to allow the pins to be decoupled without damage. The motherboard forward stop block 257 is an L-shaped member located adjacent the front connector 244. The combination of motherboard forward stop block 257, front connector 244 and guide rail 240 defines a slot 259 into which the circuit board forward stop block 261 on the circuit board 238 engages when the circuit board 238 is coupled. The height of the L-shaped motherboard forward stop block 257 and the depth of the circuit board forward stop block 261 are chosen such that when the connectors 244,258 are decoupled, the circuit board forward stop block 257 may pass over the motherboard forward stop block 26 to permit circuit board insertion and removal.

Figure 8:
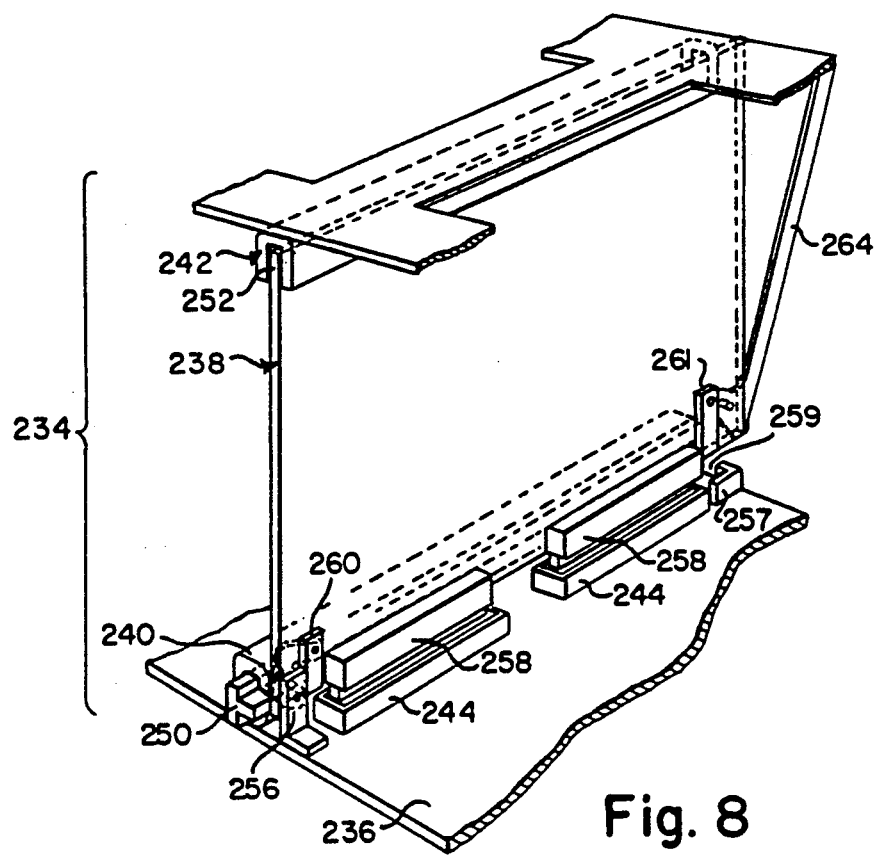
FIG. 8 is a perspective view of the device of FIG. 7, showing the circuit board with a circuit board pushed crank into a card cage by relative sliding of the rail and groove and aligned for mating with a motherboard.

Referring now to FIG. 8, the circuit board 238 with crank 264 is shown inserted into the card cage 234, with rail 250 in the channel of guide 240 and portion 252 in track 240. The circuit board connectors 258 are placed in position for mating with the motherboard connectors 244, with rear block 260 against rear block 256 and the crank 264 fully pulled out. In this position, the circuit board forward stop block 261 has passed over the motherboard forward stop block 257. Due to the positioning of the blocks 256, 260, the circuit board connectors 258 and the motherboard connectors 244 are correctly aligned for mating. It is envisaged that second block could be a flange on the circuit board 252 or even the edge of the circuit board 252 itself.

Figure 9:
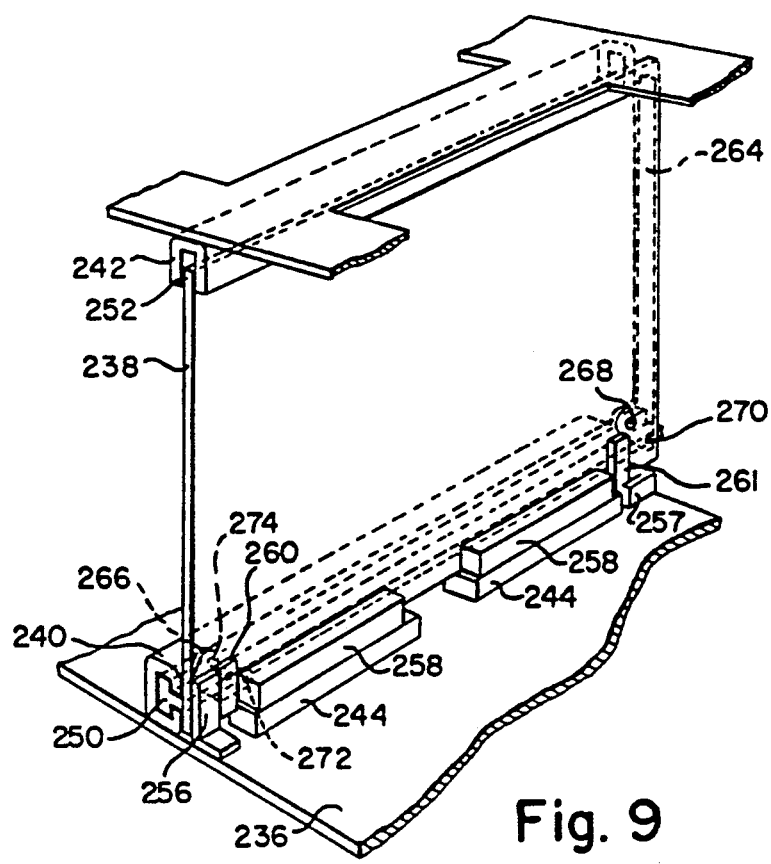
FIG. 9 is a perspective view of the device of FIG. 7, showing the circuit board with the bell crank activated to fully install and mate the circuit board with the motherboard.

In FIG. 9, the crank 264 has been pushed vertical against board 238. This has forced connectors 258 and 244 together by the force transfer between rail 250 and guide 240, and caused the forward stop block 261 of the circuit board to engage the slot 259 formed in part by the motherboard forward stop block 257.

Figure 10:
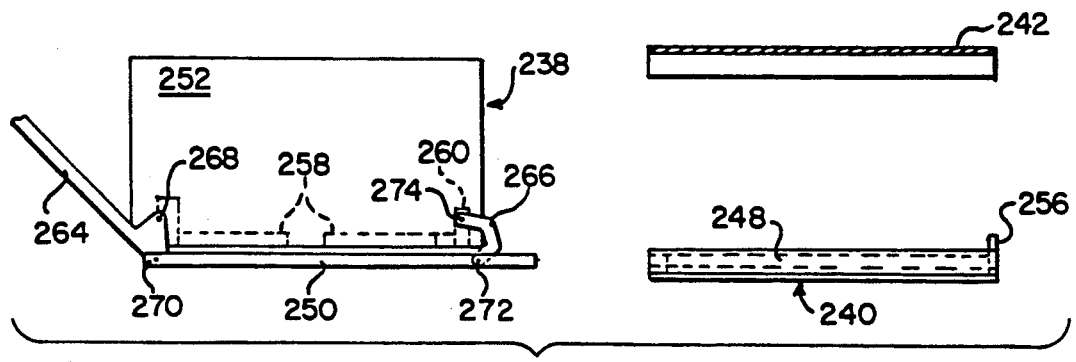
FIGS. 10, 11 and 12 show the stages of circuit board installation and connector coupling according to the present invention.
Figure 11:
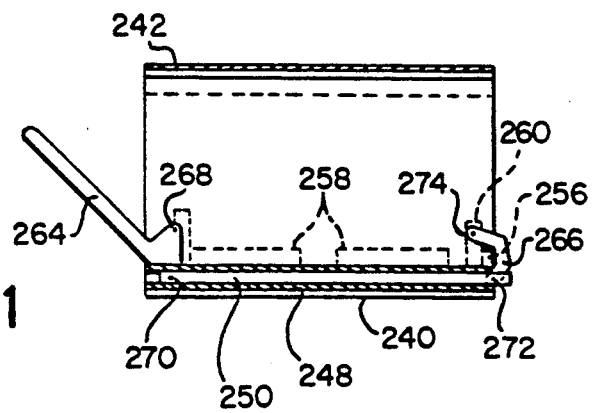
Figure 12:
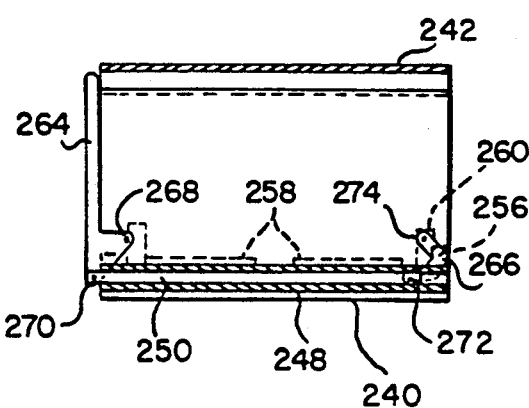

Referring now to FIGS. 10–12, shown from, the opposite side of the circuit board 238 with crank 264 the process of insertion, or removal when reversed, is shown using the invention. In FIG. 10, the board 238 is ready for insertion into the cage (or has been fully withdrawn).

With reference to FIG. 11, the rail 250 has been inserted into (or is ready for withdrawal from) the channel 248 of the lower guide 240 while the upper edge of the circuit board 252 has been inserted into the upper guide track 242, and pushed along as far as the stops 256 and 260 permit. FIG. 12 shows the circuit board with crank 238 raised to vertical, engaging the circuit board forward stop block 261 with the slot 259 formed in part by the motherboard forward stop block 257, and forcing the connectors and pins into contact achieving a fully installed position (or ready to have the crank 264 lowered to revert to the FIG. 4 condition).

In the previous embodiments shown, the circuit board 68 can not have components 10 located too close to the edge of the circuit board 68 which is opposite to the edge to which the connectors 20 are attached. The reason for this is that the circuit board 68, during insertion into and removal from the cardcage 14, is moved in a direction perpendicular to the direction of removal or insertion. As such, the tracks 17 on the side of the cardcage 14 opposite to the side with the motherboard 16 must be sufficiently deep to permit the circuit board 68 to remain engaged between the tracks 17 both during insertion and when the circuit board 68 is fully inserted. Since typically the two tracks 17 holding one end of the board are closely spaced, being separated by only slightly more than a circuit board thickness, it is necessary to keep the components from the edge of the circuit board 68 which must move between the tracks 17. This can result in the waste of board surface area.

Figure 13:
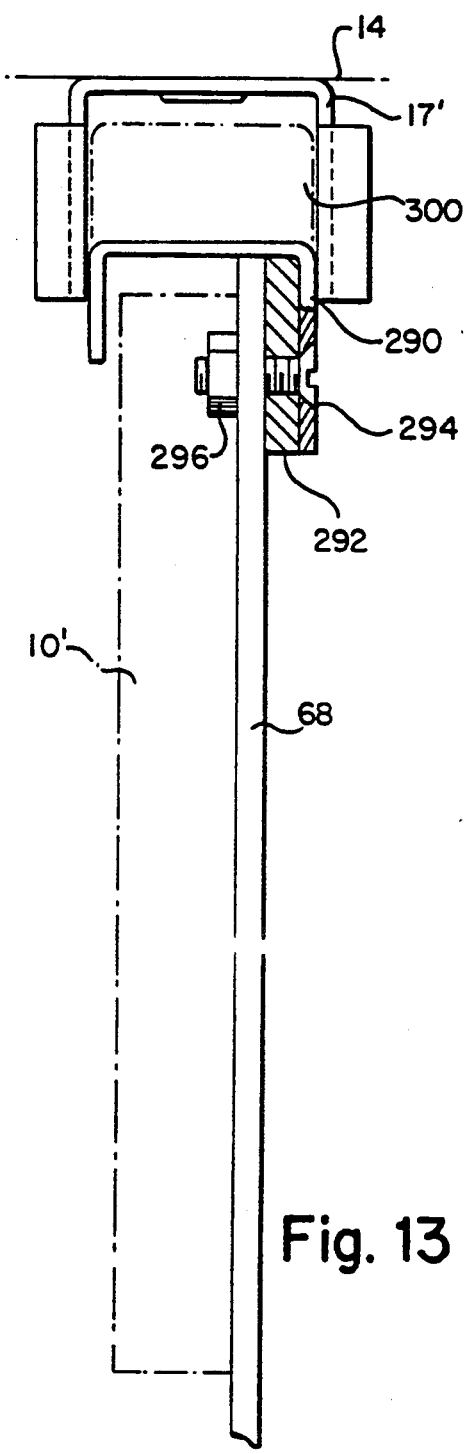
FIG. 13 depicts an end view of the upper portion of an embodiment of the circuit board and cardcage of the system configured for increased circuit board surface utilization.

Referring to FIG. 13, an embodiment of the circuit board 68 of the system is shown which permits an increased utilization of the surface area of the circuit board 68. In this embodiment, the upper track 17 of the cardcage 14 is replaced with a spacer track 17' and a spacer 290 is attached to the edge of the circuit board 68. The spacer track 17' may simply take the form of an inverted-U, while the spacer 290 takes the form of an inverted-J. The base of the inverted-J of the spacer 290 is sized to fit with the base of the inverted-U of the track 17'. The inverted-J of the spacer 290 is attached to the edge of the circuit board 68, in the embodiment shown, by a screw 294 and nut 296, but other methods of attachment may be used. The spacer 290 is separated from the circuit board 68 by a separator 292.

When the circuit board 68 is fully inserted in the cardcage 14, the spacer 290 engages the spacer track 17' near the open edge of the spacer track 290. During insertion or removal, the circuit board 68 moves up into the spacer track 17' as shown in phantom 300. Because the spacer 290 extends beyond the edge of the circuit board 68 and away from the surface of the circuit board 68, more surface space on the circuit board 68 may be allocated for components as shown in phantom 10'. Thus, less of the circuit board space is wasted without compromising the support normally provided by the upper tracks 17 of the cardcage 14.

These and other examples of the concept of the invention illustrated above are intended by way of example and the actual scope of the invention is to be determined solely from the following claims.

What is claimed is:

1. A system for inserting a circuit board connector on a circuit board into a motherboard connector on a motherboard, said system comprising:
    a tool having a sliding surface adapted to convey the circuit board across the motherboard to a stop, pins of the motherboard connector being oriented orthogonal to the direction of conveyance of the circuit board;
    said tool comprising a force transfer device including a handle for transferring force applied to said handle into force applied between the circuit board connector and motherboard connector in a direction to force the pins of the circuit board connector into contact with the pins of the motherboard connector.

2. The system of claim 1 further comprising a cam riding in a ramp in response to handle motion to effect the system of said force between connectors.

3. The system of claim 2 wherein said ramp is an edge of a first slot in said tool having said slot angled toward the surface of said motherboard when said tool is positioned on said motherboard, said first slot adapted to allow said cam to slidably move within said first slot.

4. The system of claim 3 wherein said force transfer device further comprises a second cam and second slot angled toward the surface of said motherboard when said tool is positioned on said motherboard, said second slot adapted to allow said second cam to slidably move within said second slot.

5. The system of claim 2 wherein said force applied to said handle is further transferred to said circuit board by a second cam riding on a second ramp.

6. The system of claim 1 wherein said motherboard comprises an alignment member for maintaining the alignment of said tool on said motherboard.

7. The system of claim 6 wherein said first slot and said second slot each terminate separately at the front end of said tool.

8. The system of claim 1 wherein said force transfer device further includes:
    a multiposition pin holding recess on said tool having a first position for board insertion and a second position for board extraction and an escapement which in conjunction with a stop is adapted to transfer the pin between positions for board insertion and extraction separated during tool removal and replacement.

9. The system of claim 1 wherein said tool includes a multiposition escapement engagable to toggle between board insertion and withdrawal in response to tool and stop engagement.

10. A system for connecting a circuit board edge connector on a circuit board into a motherboard connector on a motherboard, said system conveying said circuit along a conveying path board across said motherboard, wherein said system comprises:
    a motherboard comprising:
        a motherboard connector, pins of the motherboard connector oriented orthogonal to the direction of board conveying; and
    a circuit board comprising:
        a circuit board edge connector;
        a first force transfer pin fixedly attached to said circuit board and a second force transfer pin fixedly attached to said circuit board; and
    a tool comprising:
        a force transfer device coupled to said handle for transferring, by said first force transfer pin fixedly attached to said circuit board and said second force transfer pin fixedly attached to said circuit board, force applied to said circuit board along the conveying path into force applied to the circuit board in the direction of the pins of the motherboard connector, said force transfer device comprising a first slot and a second slot each angled toward the surface of said motherboard when said tool is positioned on said motherboard, said first slot adapted to allow said first force transfer pin to slidably move within said first slot and said second slot adapted to allow said second force transfer pin to slidably move within said second slot.

11. The system of claim 10 further comprising a cardcage comprising a spacer track and in which said circuit board further comprises a spacer, said spacer movably locatable within said spacer track during circuit board insertion and deletion.

12. A tool for inserting a circuit board edge connector on a circuit board into a motherboard connector on a motherboard, said tool comprising:
    a sliding surface adapted to convey the circuit board across the motherboard to a stop, pins of the motherboard connector being oriented orthogonal to the direction of conveyance of the circuit board on insertion; and
    a force transfer device including a handle for transferring force applied to said handle into force applied to the circuit board in a direction to force the pins of the circuit board into contact with the pins of the motherboard connector.

13. A circuit board having a circuit board edge connector for insertion into a motherboard connector on a motherboard comprising:
 a first force transfer coupling fixedly attached to said circuit board;
 said force transfer coupling adapted to engage a tool simultaneously with the engagement of said tool by a motherboard coupling to cause said motherboard and circuit board connectors to be pulled respectively together and apart upon tool movement across the motherboard in respective first and second opposite directions thereby transferring force applied to said tool into force applied to the circuit board in a direction to force the pins of the circuit board into contact with pins of the motherboard connector without application of bowing force to said circuit board.

14. The circuit board of claim 13 further comprising a spacer, said spacer movably locatable within a spacer track of a cardcage during circuit board insertion an deletion.

15. The circuit board of claim 13 wherein said first force transfer coupling is adapted to slidably move within a first slot within said tool, said first slot angled toward the surface of said motherboard when said tool is engaged by the coupling on said motherboard.

16. The circuit board of claim 15 wherein said circuit board further comprises a second force transfer coupling fixedly attached to said circuit board by which force is further transferred to said circuit board by said tool.

17. A motherboard comprising:
 a motherboard connector adapted for mating with a circuit board connector on a circuit board;
 said motherboard having a coupling for slidably engaging a tool to convey the circuit board across the motherboard, with pins of the motherboard connector being oriented orthogonal to the direction of conveyance of the circuit board, and to transfer force applied to said tool into a force applied between said circuit board and said motherboard in a direction to force the pins of the circuit board connector into contact with the pins of the motherboard connector.

18. The motherboard of claim 17 wherein said circuit board comprises a spacer movably locatable within a spacer track of a cardcage, in which said motherboard is located, during circuit board insertion and deletion.

19. The motherboard of claim 17 wherein said motherboard further comprises an alignment member for maintaining the alignment of said tool on said motherboard.

* * * * *